(12) United States Patent
Horn (10) Patent No.: US 7,375,332 B1
(45) Date of Patent: May 20, 2008

(54) LASER-BASED IRRADIATION APPARATUS AND METHOD TO MEASURE THE FUNCTIONAL DOSE-RATE RESPONSE OF SEMICONDUCTOR DEVICES

(75) Inventor: Kevin M. Horn, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 161 days.

(21) Appl. No.: 11/366,289

(22) Filed: Mar. 2, 2006

Related U.S. Application Data (63) Continuation-in-part of application No. 11/315,676, filed on Dec. 22, 2005, now abandoned, which is a continuation-in-part of application No. 10/810,420, filed on Mar. 25, 2004, now Pat. No. 7,019,311.

(51) Int. Cl.
*G01R 31/00* (2006.01)
(52) U.S. Cl. .................................. 250/338.4; 324/501
(58) Field of Classification Search ............. 250/341.4, 250/338.4; 324/501
See application file for complete search history.

(56) References Cited

U.S. PATENT DOCUMENTS

| | | | | | |
|---|---|---|---|---|---|
| 5,532,607 | A | * | 7/1996 | Inuzuka | 324/750 |
| 5,754,289 | A | * | 5/1998 | Ozaki | 356/301 |
| 6,066,956 | A | * | 5/2000 | Nikawa | 324/752 |
| 2003/0146761 | A1 | * | 8/2003 | Pakdaman | 324/501 |

* cited by examiner

*Primary Examiner*—Georgia Epps
*Assistant Examiner*—Tony Ko
(74) *Attorney, Agent, or Firm*—Kevin W. Bieg (57) ABSTRACT

A broad-beam laser irradiation apparatus can measure the parametric or functional response of a semiconductor device to exposure to dose-rate equivalent infrared laser light. Comparisons of dose-rate response from before, during, and after accelerated aging of a device, or from periodic sampling of devices from fielded operational systems can determine if aging has affected the device's overall functionality. The dependence of these changes on equivalent dose-rate pulse intensity and/or duration can be measured with the apparatus. The synchronized introduction of external electrical transients into the device under test can be used to simulate the electrical effects of the surrounding circuitry's response to a radiation exposure while exposing the device to dose-rate equivalent infrared laser light.

19 Claims, 11 Drawing Sheets

LASER-BASED IRRADIATION APPARATUS AND METHOD TO MEASURE THE FUNCTIONAL DOSE-RATE RESPONSE OF SEMICONDUCTOR DEVICES

CROSS-REFERENCE TO RELATED APPLICATIONS

This application is a continuation-in-part of U.S. patent application Ser. No. 11/315,676, filed Dec. 22, 2005, now abandoned which is a continuation-in-part of U.S. patent application Ser. No. 10/810,420, filed Mar. 25, 2004, now U.S. Pat. No. 7,019,311, which are both incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to ionizing radiation effects in semiconductor devices and, in particular, to a laser-based irradiation apparatus and method to measure the functional and parametric response of semiconductor devices to pulsed laser irradiation.

BACKGROUND OF THE INVENTION

The effects of harsh radiation environments, such as are encountered in space, military, or nuclear power applications, are known to have deleterious effects on semiconductor devices and circuits. Recent studies have further shown that prolonged exposures to even low levels of radiation can degrade the performance of electronic devices. Compounding these effects, the continued reduction in feature size of modern commercial integrated circuits (ICs) can result in these devices becoming even more sensitive to transient ionizing radiation effects. Ionizing radiation produces electron-hole pairs (i.e., electrical charge) in semiconductor material that may be collected by potentially sensitive circuit nodes. The generation and collection of this unintended electrical charge within the circuit can alter the performance and reliability of specific circuit structures within the device.

It is particularly desirable to be able to measure and monitor changes in the electrical charge collection within a device to detect changes in its radiation response with age. Age-related changes in the radiation response of numerous types of semiconductor devices have been reported by several groups in recent years. See A. P. Karmarkar et al., "Aging and Baking Effects on the Radiation Hardness of MOS Capacitors," *IEEE Trans. Nucl. Sci.* 48(6), 2158 (2001); and V. S. Pershenkov et al., "Effect of Aging on Radiation Response of Bipolar Transistors," *IEEE Trans. Nucl. Sci.* 48(6), 2164 (2001). Studies of aging in ICs suggest that achieving a detailed understanding of some of the natural changes that occur in these devices over long storage times requires detailed, repeated and non-destructive examination of the functional and parametric properties of the dose-rate response of semiconductor devices.

Historically, the greatest obstacle to measure the radiation response of electronic devices used in long-lived electrical systems has been the destructive nature of most traditional radiation testing techniques. The accumulation of total dose damage with each subsequent re-test of a device can change its radiation response, (e.g. dose-rate, single event upset, single event latch-up, or burn-out) independent of any other hidden aging effects. Therefore, a need remains for a non-destructive method to measure the dose-rate response of semiconductor devices, particularly as they age.

In most modern semiconductor devices, it is only the charge produced in the top few tens of microns of silicon that can be collected by the electrically active regions of the device; electron-hole pairs produced deeper in the silicon (i.e., in the heavily doped silicon beneath the epitaxial layer) recombine before reaching sensitive circuit nodes. Thus, while it is true that the exposure of a silicon device to severe gamma- or x-ray fluxes gives rise to electron-hole pair production throughout the entire silicon die (and package and circuit board and the entire system), the vast majority of this electrical charge has no path to directly affect the internal electrical operation of the IC. If the charge is not produced within a diffusion length of the electrically active regions of the circuit, it will merely recombine, or be trapped, without perturbing the circuit.

According to the present invention, an infrared laser of tens of watts can produce as many electron-hole pairs in the electrically active regions of a semiconductor device as are produced during severe radiation exposures of MeV gamma-rays or keV x-rays. The apparently huge difference in power between the laser and the gamma- or x-ray exposure conditions is reconciled not when viewed in terms of how much energy the device is exposed to, but rather how much of that energy is actually deposited in the device where it can affect the device's electrical operation. When viewed in this context, very few of the incident gamma- or x-rays actually produce electron-hole pairs within the device and even fewer of these electron-hole pairs are produced within the collection volume of the electrically active regions of the device. Therefore, infrared laser-based irradiation testing can produce dose-rate response in semiconductor devices that replicates the response to much more penetrating ionizing radiations.

Furthermore, laser-based probing can detect aging effects without the damage associated with particle beam or x-ray exposure techniques. Thus, dose-rate failure testing of ICs can be performed repeatedly, non-destructively, and inexpensively on a bench top. It is important to note that broad beams of energetic x-rays or electrons provide higher fidelity simulations of actual high-energy radiation environments than the infrared laser. Indeed, such exposures reproduce many bulk material radiation effects (e.g., shock, thermal effects, and secondary radiations) that the laser cannot. However, in the context of photocurrent collection and circuit electrical operation, the additional energy deposition deep in the sample only produces electron-hole pairs that may contribute to thermal and mechanical effects, but not to electrical behavior.

SUMMARY OF THE INVENTION

The present invention is directed to a broad-beam laser irradiation apparatus for measuring the dose-rate response of a semiconductor device under test (DUT), comprising at least one infrared laser that produces a broad-area pulse of laser light, having a laser pulsewidth and intensity, directed onto the surface of the semiconductor device, and means for measuring the dose-rate response resulting from the laser irradiation of the surface of the semiconductor device. The infrared laser can be a laser diode. The apparatus can further comprise means for varying the pulsewidth and intensity of the laser pulse. The apparatus can further comprise an imaging device to image the laser irradiation and an energy detector to measure the energy of the laser irradiation of the surface of the semiconductor device. One or more beam splitters can be used to simultaneously measure the energy transmitted to the device from the one or more laser sources. The broad-beam laser irradiation apparatus can be used for non-destructive, bench-top, dose-rate equivalent testing of semiconductor devices, and in a specific application, can determine if aging has affected the device's overall functionality. Further, for devices exposed to dynamically changing radiation environments, the apparatus can replicate the time-varying, dose-rate intensity of a space, high altitude, or hostile military environment.

The invention is further directed to a method for measuring the dose-rate response of a semiconductor device under test, comprising exposing the surface of the semiconductor device to a broad-area pulse of light, having a laser pulse-width and intensity, from at least one infrared laser, and measuring the dose-rate response resulting from the laser irradiation of the surface of the semiconductor device. The method can further comprise repeating the exposing and measuring steps at least once at a different laser deposited energy or laser pulsewidth to determine the deposited energy dependence or pulsewidth dependence of the failure of the semiconductor device. The electrical response parameters can be compared to a manufacturer-specified acceptable range to determine if the dose rate-equivalent, modulated laser exposure caused functional failure of the semiconductor device. The method can further comprise injecting at least one electrical transient into an electrical line of the semiconductor device during the exposing step. The synchronized introduction of external electrical transients into a device can be used to simulate the electrical effects of the surrounding circuitry's response to a radiation exposure.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

For use in radiation effects testing, infrared laser light can replicate the charge collection effects of far more penetrating ionizing radiations. This replication is possible, since only the charge produced in the first few tens of microns of silicon contributes to charge collection within the electrically active regions in most modern semiconductor devices. Electron-hole pairs produced deeper in the device by more penetrating radiations, such as x-rays, gamma-rays, or energetic electrons or ions, recombine before collection into circuit structures near the device surface, and therefore do not affect the normal electrical operation of the device. Consequently, the charge generated in the electrically active regions of the device by the deposition of the laser energy can be made comparable to the total charge generated in those same regions by far more penetrating radiation.

Among the most widely-used commercial lasers for laser-based radiation testing are Nd:YAG (Nd:YVO$_4$) lasers which operate at a wavelength of approximately 1064 nanometers with a corresponding penetration depth, or absorption length, of approximately 300 microns in silicon. The laser-based irradiation apparatus of the present invention preferably uses a shorter wavelength laser having a shorter penetration depth. For example, 904-nm-wavelength laser light from a laser diode or laser diode array has a penetration depth of about 30 microns. As a consequence of this difference in penetration depth, the Nd:YAG laser requires much more power to achieve the same dose rate-equivalent charge density in the electrically active regions of the IC. This is because the electrically active regions of the IC are typically in the top 15 microns of the die. Thus, the 904-nm-wavelength laser light can achieve the same density of charge in the electrically active regions of the silicon (e.g., the top 15 microns) at a lower power than the Nd:YAG laser because the shorter wavelength light produces electrical charge only in the regions of the device from which it can be collected. This, in turn, allows the duty cycle of the laser's operation to be greater and permits the automated measurement of a target device's functionality during a range of dose rate-equivalent exposures. Additionally, the diode laser can be fired on-demand, rather than at a fixed repetition rate, which also facilitates its use in an automated data-collection mode. Finally, laser diodes that emit at other wavelengths, including 1064 nm, can be used to create varying depths of penetration of the laser light and thereby enable the investigation of the depth dependence of a device's charge collection efficiency.

Figure 1A:
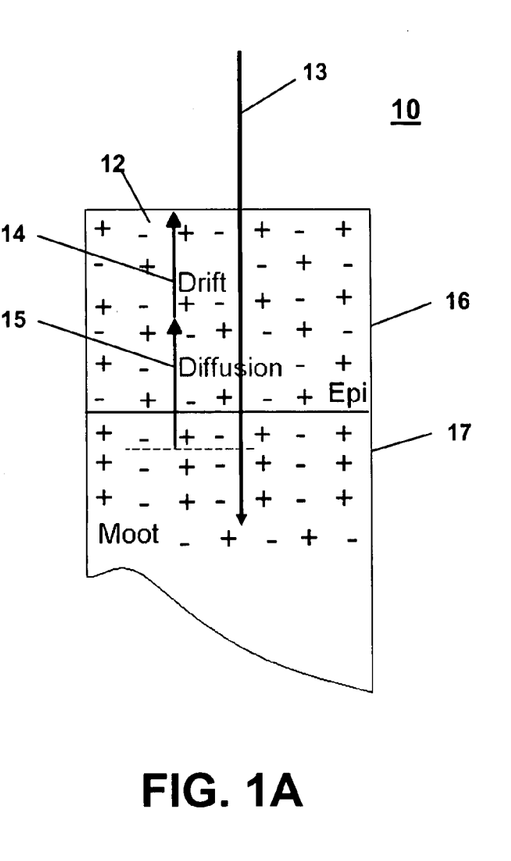
FIG. 1A shows the mechanisms and length-scales for the collection of photocurrent in the electrically active region of a silicon device following an ionizing radiation exposure.

In FIG. 1A is illustrated the mechanisms and length-scales for the collection of photocurrent in the electrically active region of a silicon device following an ionizing radiation exposure. The photocurrent collected in the electrically active region (e.g., a p-n junction) 12 of a semiconductor device 10 results from the generation of electron-hole pairs in the semiconductor material by an ionizing radiation exposure 13. Typically, the radiation exposure 13 will penetrate the device 10 to a depth well below the active region 12 and will generate electron-hole pairs (i.e., electrical charge) all along its path. The charge collected at the active region 12 is generally modeled as a combination of a prompt drift component 14 and a slower diffusive component 15. The prompt current 14 results from charge collection by drift due to the local electric field in the depletion region of the device 10. The physical extent of prompt charge collection 14 around a field-free depletion region is characterized by a collection distance given by the Debye length. The Debye length is dependent upon the permittivity, temperature, and dopant concentrations within the depleted regions and is typically only a few microns, or less. The slower diffusive component 15 of the charge collection is due to charge that must diffuse to the depletion region prior to being collected. The characteristic length of the slower diffusive component 15 is defined by the diffusion length, which is governed by the carrier lifetime, diffusion coefficient, and, implicitly, temperature and carrier mobility. Diffusive charge collection from beneath the epitaxial layer 16 is usually negligible, due to the dominant role of charge recombination resulting from the much higher dopant concentrations (and, therefore, far shorter carrier lifetimes) in the silicon substrate 17. The silicon epitaxial layer thickness is typically about 10 microns or less. Thus, while an actual penetrating radiation exposure 13 may produce charge throughout the entire depth of a silicon device 10, it is only that portion of the charge which is produced within the Debye length or diffusion length of an active circuit node 12 that is collected; charge produced at depths greater that these characteristic lengths undergoes recombination and makes little contribution to measured photocurrents.

Figure 1B:
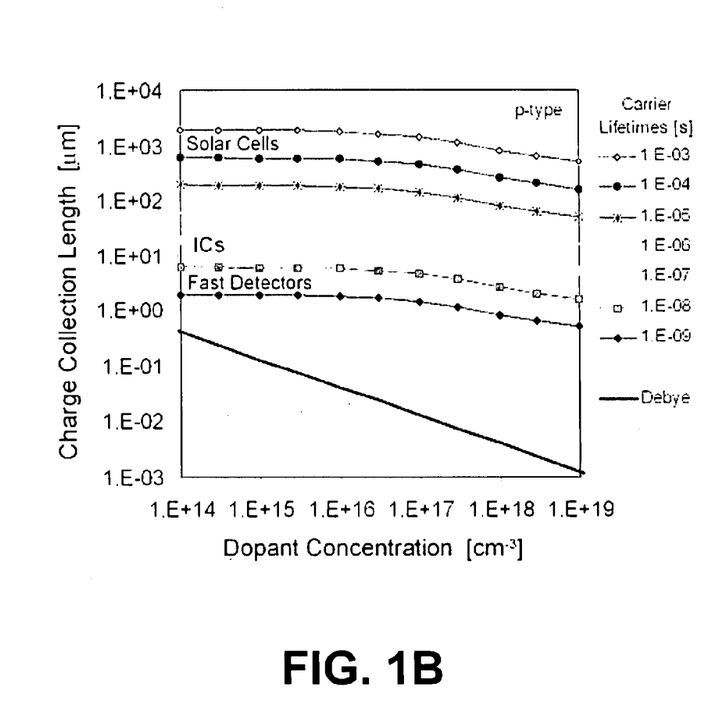
FIG. 1B shows the Debye length and diffusive charge collection length as a function of dopant concentration for a range of carrier lifetimes in p-type silicon.

In FIG. 1B is shown the charge collection length as a function of p-type dopant concentration for a variety of silicon junction devices. As expected, the Debye screening length decreases approximately as the inverse square root of the dopant concentration. The diffusion length is much longer than the Debye length, and strongly depends on the carrier lifetimes of the device. For most modern semiconductor logic devices, with dopant concentrations of $10^{15}$-$10^{18}$ atoms/cm$^3$ and minority carrier lifetimes of less than several hundred nanoseconds, typical diffusion lengths are less than approximately 15 microns. Such devices can be easily tested with the present invention. Devices with intentionally longer carrier lifetimes, such as photovoltaic solar cells, which are intended to collect as much charge as possible under light exposure, typically have charge collection lengths far in excess (e.g., 1000 microns) of the exposure depths of the lasers used in the present invention.

Figure 2:
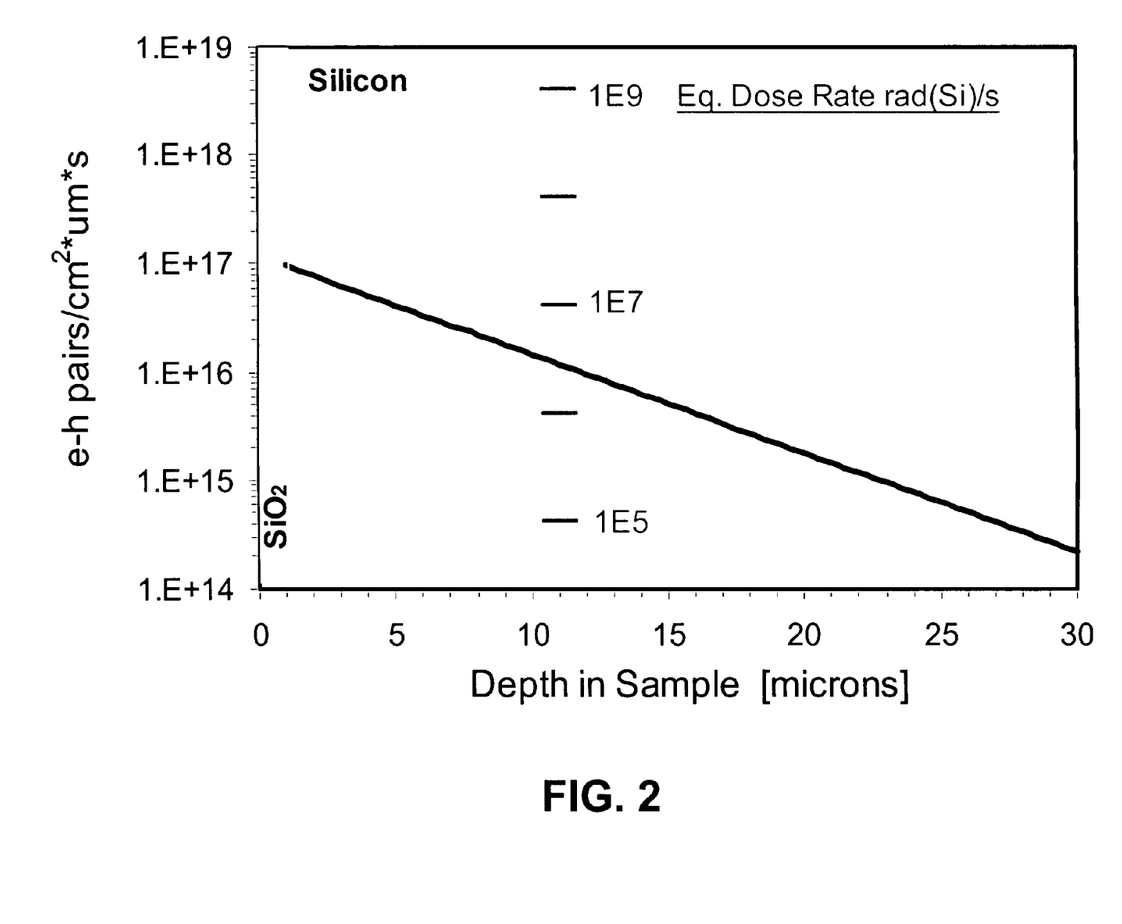
FIG. 2 shows the calculated electron-hole pair concentration as a function of depth resulting from a 1 microsecond long laser exposure of 904-nm-wavelength laser light directed from a 60W laser diode onto a silicon substrate capped by a 1-μm-thick $SiO_2$-passivation layer.

In FIG. 2 is shown the calculated electron-hole pair concentration (note the logarithmic scale ordinate) as a function of depth, resulting from a broad-beam (i.e. not focused) 904-nm-wavelength laser irradiation of a silicon substrate capped by a 1-μm-thick SiO$_2$ passivation layer. Light with a wavelength of 904 nm (i.e., 1.3 eV, slightly above the silicon band edge) has an absorption length of about 30 μm in silicon. The depth at which charge is generated can be changed by selecting a different wavelength laser diode. The exponential attenuation of the laser power as the beam penetrates the silicon causes a decrease in charge density with depth. Also shown are the equivalent dose rates for a 10 MeV, 1 μs electron exposure, in rad(Si)/s. Since the range of electrons in silicon is very long, stopping-power calculations indicate a constant electron dose rate over this depth. As can be seen, the average electron-hole density created by a 60 W infrared laser deposition over the first ten microns in this silicon structure is comparable to a $10^7$ rad(Si)/sec electron irradiation. Of course, this equivalent charge density is produced only within the first ten microns of silicon beneath laser beam spot. However, as described above, this surface region dominates the charge collection of the circuit.

Two main limitations exist in laser-based imaging: the presence of opaque metallizations in the circuit, and variations in surface reflectivity that reduce, but do not block, the charge generation beneath the laser beam spot.

Metallizations effectively shield the underlying circuit elements from the charge-generating laser beam. However, since circuit metallizations scale in size with other features of the device, the distance between circuit structures and adjacent unmetallized silicon also scales with the feature size. Thus, a broad beam exposure will flood the surface region with charge that dissipates laterally and will be collected into active circuit structures. A correction factor to account for partial opaque coverage by metal in the device can be calculated from the fractional areal coverage of the metal visible in an optical micrograph of the device, or from comparison of test results to other non-laser dose-rate results on a calibration device. Shadowing effects can also be reduced by employing two laser beams incident to the device surface at orthogonal azimuthal angles relative to each other.

Non-uniform surface reflectivity is a slightly more insidious problem. However, surface reflectivity can be compensated for by measuring the reflected portion of the incident light beam and re-normalizing the resulting charge measurement to the reduced light intensity actually delivered to the surface. The calculated electron-hole pair concentrations shown in FIG. 2 include the effects of light reflection at each interface. For the purposes of monitoring changes in device radiation response with age, surface reflectivity is not a major concern since local differences in surface reflectivity will remain constant for each device from measurement to measurement and aging can be monitored as a relative change in device response with time.

Broad-Beam Laser Irradiation Apparatus

The broad-beam laser irradiation apparatus of the present invention can be used to measure the functional or operational failure of entire silicon integrated circuits and circuit fragments exposed to a broad area, dose-rate equivalent, laser exposure. For the purposes of detecting and tracking age-induced changes in circuit photocurrent response to ionizing radiation, electrical parametric measurements can be used in conjunction with laser dose-rate testing to compare changes in the overall circuit response during various stages of controlled aging. The devices being studied can be measured periodically during storage in their particular aging environments (e.g., thermal, gamma, neutron, hydrogen, plus combinations) to extract time-dependencies of the changes. The broad-beam laser irradiation apparatus can also be used to test the functionality of an entire IC while embedded in a functioning circuit board or circuit board fragment.

Figure 3A:
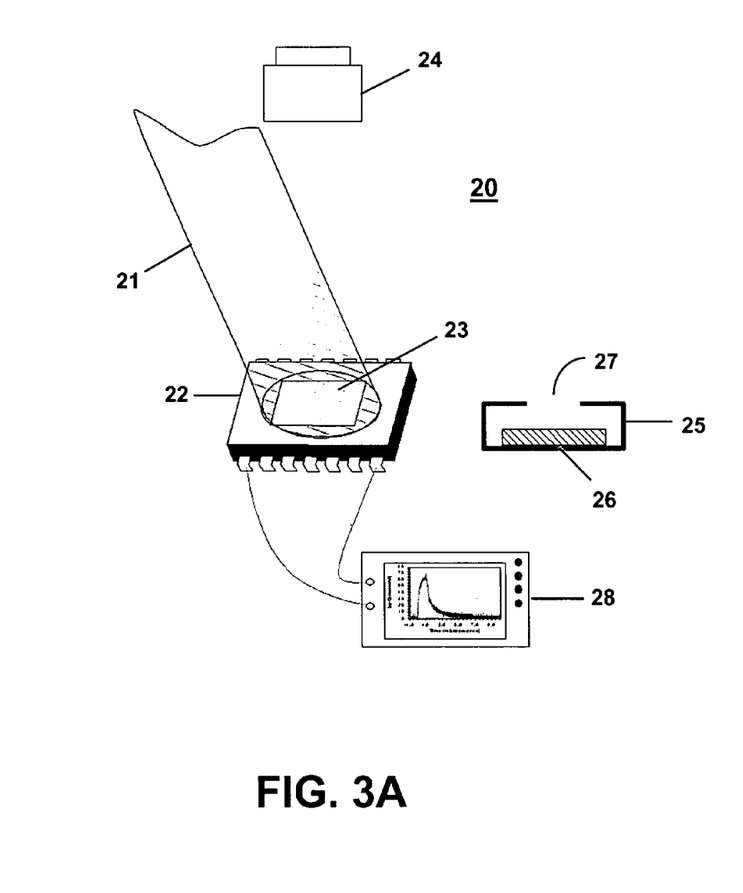
FIG. 3A shows a schematic illustration of a broad-beam laser irradiation apparatus, wherein a broad beam of laser light is delivered to a semiconductor DUT.
Figure 3B:
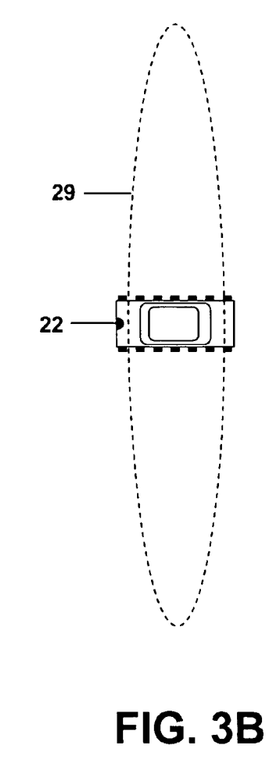
FIG. 3B shows a schematic illustration of a typical laser exposure footprint superimposed on the DUT.

In FIG. 3A is shown an embodiment 20 of the broad-beam laser irradiation apparatus that can be used to measure the dose-rate response of a semiconductor DUT 22. With this embodiment 20, an ionizing pulse of laser light 21 can be directed onto the surface of the exposed silicon die 23 within the de-lidded DUT 22. The duration (pulse width) and intensity of the laser pulse 21 can be controlled programmatically by software. The laser pulse 21 can be produced by one or more laser diodes. Other types of pulsed broad-beam laser sources can also be used. The DUT 22 and the fixture in which it is mounted can be held on an adjustable xy-stage to permit the DUT 22 to be centered within the exposure area of the laser 21. An imaging device 24, for example a charge coupled device (CCD) camera, can be configured so as to synchronize its capture of a single frame with the firing of the laser 21. In this manner, the exposure area, or footprint, of the laser illumination with respect to the DUT can be documented. In FIG. 3B is shown a schematic illustration of a typical laser exposure footprint 29 superimposed on the DUT 22.

The images captured by the imaging device 24 can be used to center the DUT 22 within the illumination area of the laser light 21. Furthermore, by replacing the DUT 22 with a uniformly reflecting surface that extends beyond the laser's entire exposure area, a quantitative measure of the beam uniformity can be obtained from the image acquired during the synchronous firing of the laser. Each element of the CCD array within the imaging device measures the light intensity reflected from a different spatial position on the uniformly reflecting surface. As such, any non-uniformity in the resulting image captured by the imaging device 24 during the laser exposure of the uniform reflector will indicate non-uniformity in the laser intensity.

The energy of the laser exposure can be measured by positioning a commercial laser energy detector 25 within the laser exposure footprint, either during the exposure of the DUT 22, or during a subsequent laser exposure that uses the same laser diode injection current magnitude and duration. The energy detector 25 can measure the energy deposition of a single laser pulse. The detector 25 can comprise a lithium tantalate detector material 26 having an acceptance area defined by a fixed aperture 27 above the detector material. Other types of energy detectors can also be used.

Figure 4:
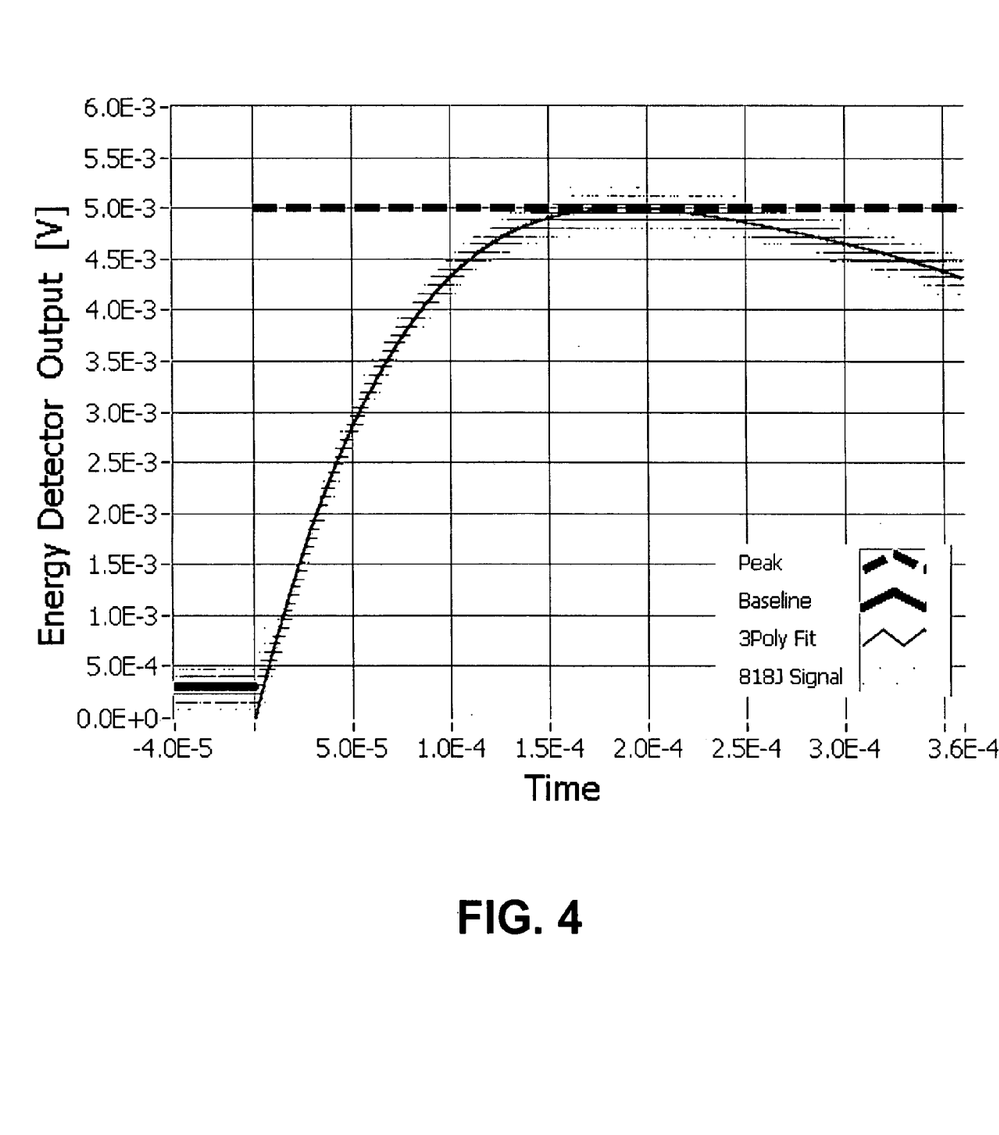
FIG. 4 shows a plot of the energy detector output signal and curve fitting results to determine the laser pulses' energy.

In FIG. 4 is shown a typical output signal from the energy detector 25 when exposed to a pulse of laser radiation. The control software performs a curve fit to the digitized energy detector signal to determine the baseline and maximum voltage levels of the signal. The experimentally measured energy of the laser pulse can then be calculated from this absolute voltage step using the vendor-supplied calibration factor of the detector. This energy value, in Joules, can then be used to determine the equivalent dose-rate in Rad(Si)/s for the specific pulse width used in the exposure.

The dose-rate response of the DUT 22 can be recorded in the form of: (1) the total charge collection from the device, (2) a current transient measured from the device's power or ground lines, (3) a change or transient in a known device output (e.g. a logic level output, set via configuration of the DUT to be a fixed, constant value), or (4) other physical responses of the circuit. A charge collection signal is typically measured from the power or ground lines of the device with a current-viewing transformer, or resistor, and recorded with a waveform digitizer 28.

Figure 5A:
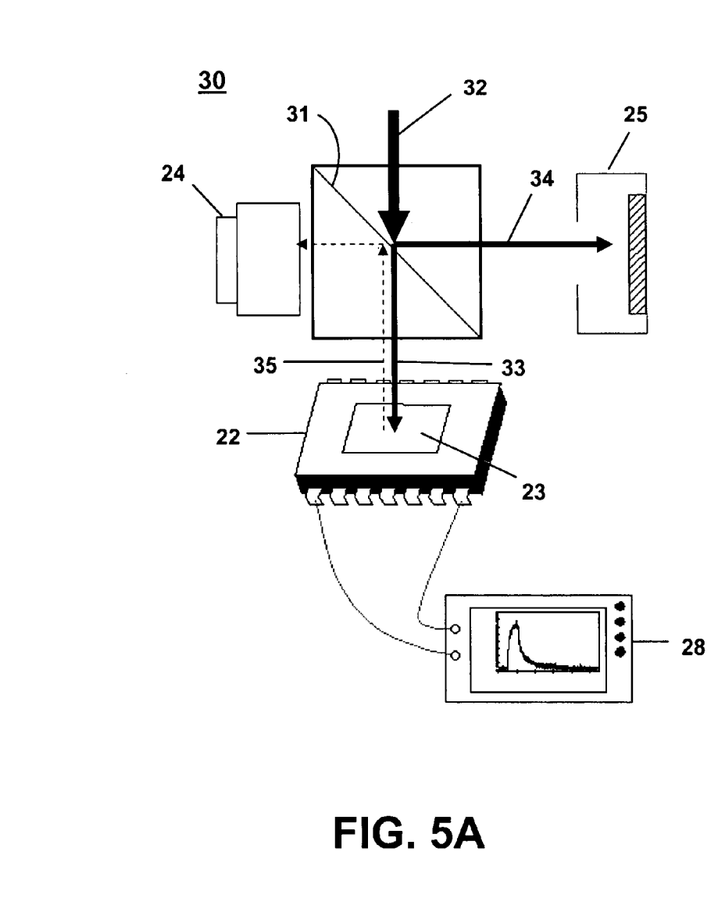
FIG. 5A shows a schematic illustration of a broad-beam laser irradiation apparatus utilizing a beam splitter to simultaneously measure the laser beam energy and image the exposure area of the DUT.

Using beam splitters, the laser pulse energy, laser beam uniformity, and the position of the semiconductor device within the exposure area of the laser beam can be simultaneously measured during each exposure of a sequence of exposures. In FIG. 5A is shown an embodiment 30 in which a beam splitter 31 is employed to transmit a fixed fraction 33 of the incident laser beam 32 toward the DUT 22, while the remainder 34 of the beam 32 is reflected onto the energy detector 25. The beam splitter 31 is selected so as to: (1) match the wavelength of the laser light source, (2) accommodate the heat loads from energy deposition in the beam splitter by the laser pulses, (3) accommodate the lateral size of the laser beam, and (4) provide the desired fractional split between transmission 33 and reflection 34 of the incident laser beam 32. For the examples presented herein, a 50-50 beam splitter was used (i.e. 50% of the incident beam is transmitted straight through the beam splitter and 50% of the incident beam is reflected at a right angle to the incident path). Other fractional splits and angles of reflection can be used.

By virtue of the beam splitter 31 dividing the incident laser beam 32 into two orthogonal beams of fixed relative intensity, the energy of each laser pulse used to expose the DUT 22 can be sampled by the energy detector 25 simultaneously with the DUT exposure. The energy measured from this pulse can be corrected for any differences in geometry or path length that exist between the reflecting interface of the beam splitter 31, the DUT 22 and energy detector 25. This calibration can readily be done by positioning a second energy detector in the DUT position, and simultaneously measuring the energy of laser pulses at both positions, thereby arriving at the fractional correction to apply to the energy measurements made by the permanent energy detector 25.

Figure 5B:
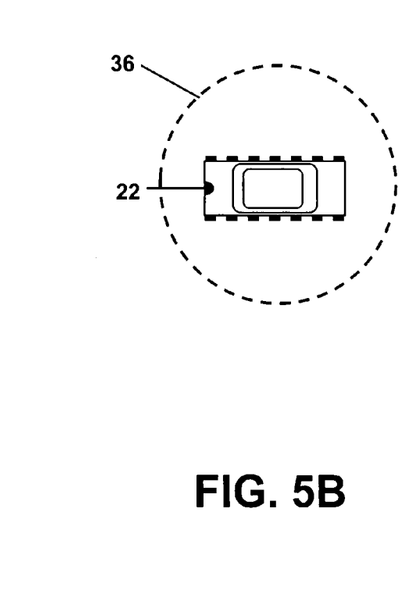
FIG. 5B shows a schematic illustration of a typical laser exposure footprint superimposed on the DUT, that can be captured by the imaging device through the beam splitter.

An imaging device 24 can capture light 35 reflected from the DUT surface that enters the underside of the beam splitter and is reflected into the imaging device 24. In FIG. 5B is shown a schematic illustration of a typical laser exposure footprint 36 superimposed on the DUT 22, that can be captured by the imaging device through the beam splitter. As with the prior embodiment, the DUT 22 can be centered within the laser footprint, the uniformity of the laser footprint measured, and the DUT response recorded.

Figure 6:
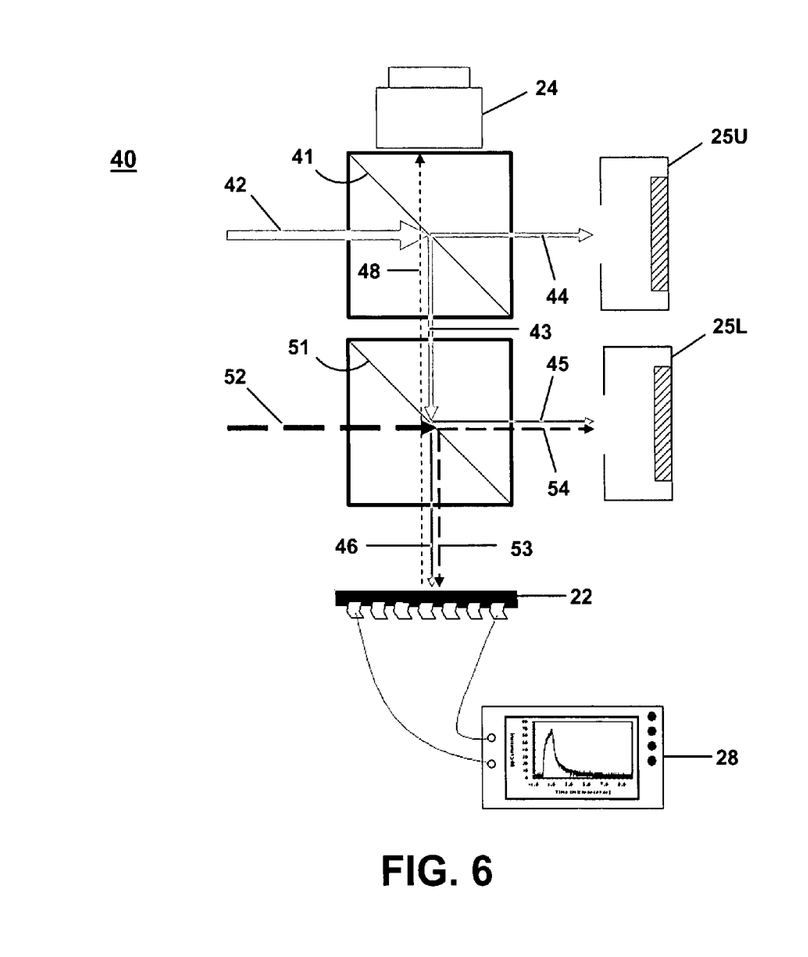
FIG. 6 shows a schematic illustration of a broad-beam laser irradiation apparatus, wherein multiple beam splitters are aligned so as to direct multiple independent laser sources onto a single exposure area containing the DUT.

In FIG. 6 is shown another embodiment 40 in which one or more additional upper beam splitters 41 can be positioned above a lower beam splitter 51, to permit multiple laser light sources 42 and 52 to be brought into a single optical path directed onto the DUT 22. Although only two beam splitters 41 and 51 are shown in FIG. 6, this embodiment can be extended to include any number of beam splitters and laser light sources.

The upper laser light source 42 directs its output into the upper beam splitter 41 which reflects a fixed fraction 43 of the incident laser light 42 downward. The reflected laser beam 43 enters the top of the lower beam splitter 51. The transmitted laser beam 44 of the upper laser beam 42 passes through the upper beam splitter 41 and into an upper energy detector 25U. The upper energy detector 25U measures the energy of the transmitted fractional component 44 of the laser pulse emitted by the upper laser source 42.

The reflected portion 43 of the upper laser beam 42 enters the lower beam splitter 51 and again is split into fixed fractions of reflected 45 and transmitted 46 beams. That portion 46 of the upper beam 43 that is transmitted through the beam splitter 51 combines with the reflected portion 53 of the incident beam from the lower laser source 52. This combined laser beam 46 and 53 is then incident on the DUT 22. The combined laser beam 46 and 53 comprises the superimposed temporal and intensity characteristics of the upper 42 and lower 52 laser beams, after reflection and transmission through their respective optical paths.

That portion 54 of the lower incident beam 52 which is transmitted through the lower beam splitter 51 combines with the reflected portion 45 of the upper beam 43 and is detected by the lower energy detector 25L. This energy detector 25L, then, measures the combined energy deposition of the upper 42 and lower 52 laser pulses, (unlike the upper energy detector 25U which measured the energy deposition of only the upper laser pulse 42). By subtracting the result of upper energy detector measurement from the lower energy detector measurement, the energy of the transmitted portion 54 of the lower laser beam pulse 52 can be determined. Each energy detector can be calibrated for the geometric differences in the light paths of each laser beam component using the same procedures described above. The image capture device 24 can be positioned above the upper beam splitter 41 where it captures the image of the DUT 22 along the optical path 48.

Dose-Rate Failure Testing

Figure 7:
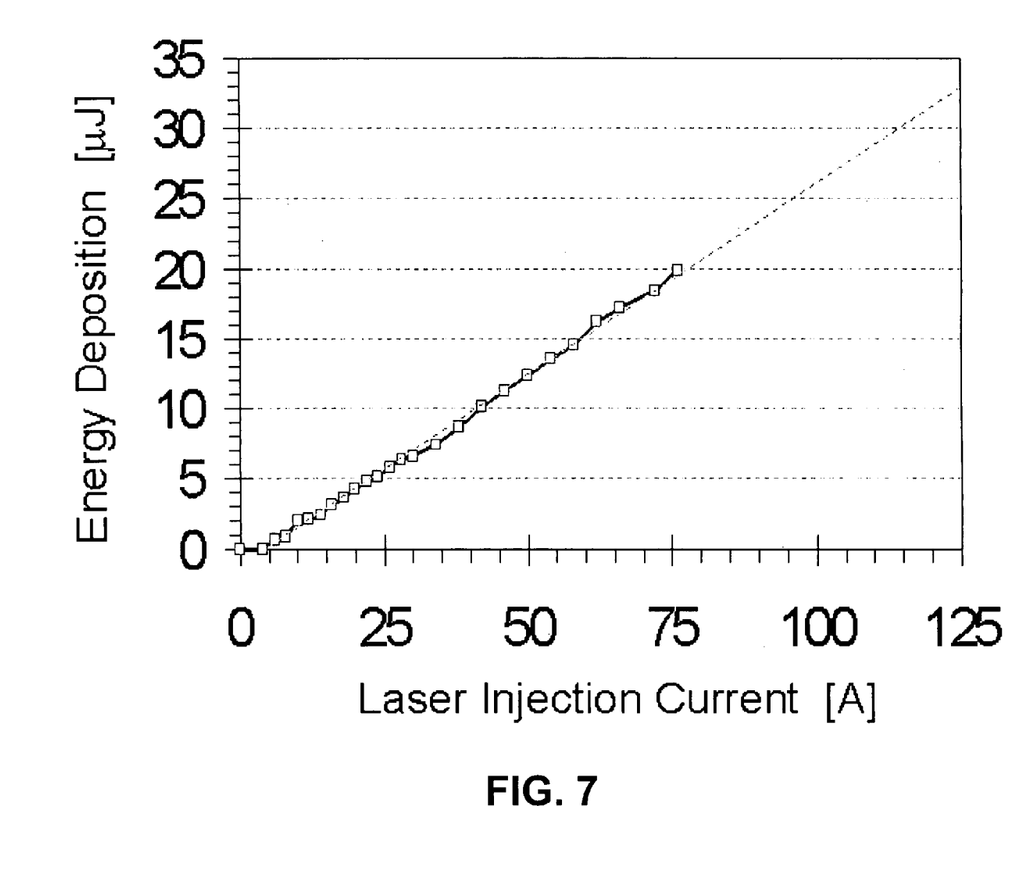
FIG. 7 shows the linear relationship between the current injected into a laser diode array and the measured energy deposition of the laser beam used in the laser exposure apparatus.

The broad-beam laser irradiation apparatus can be used to conduct bench-top dose-rate failure tests over a range of dose-rates. The injection current into the laser diode or laser diode array can be varied to change the dose-rate equivalent pulse intensity. The laser pulse energy can be calibrated to the injection current for each laser light source used. As shown in FIG. 7, by increasing the injection current into the laser diode array, the energy deposition and thereby the equivalent dose-rate delivered to the DUT, can be increased in a linear fashion. Therefore, by controlling the energy deposition into the target over a controlled period of time, the effective dose-rate can be selected.

Figure 8:
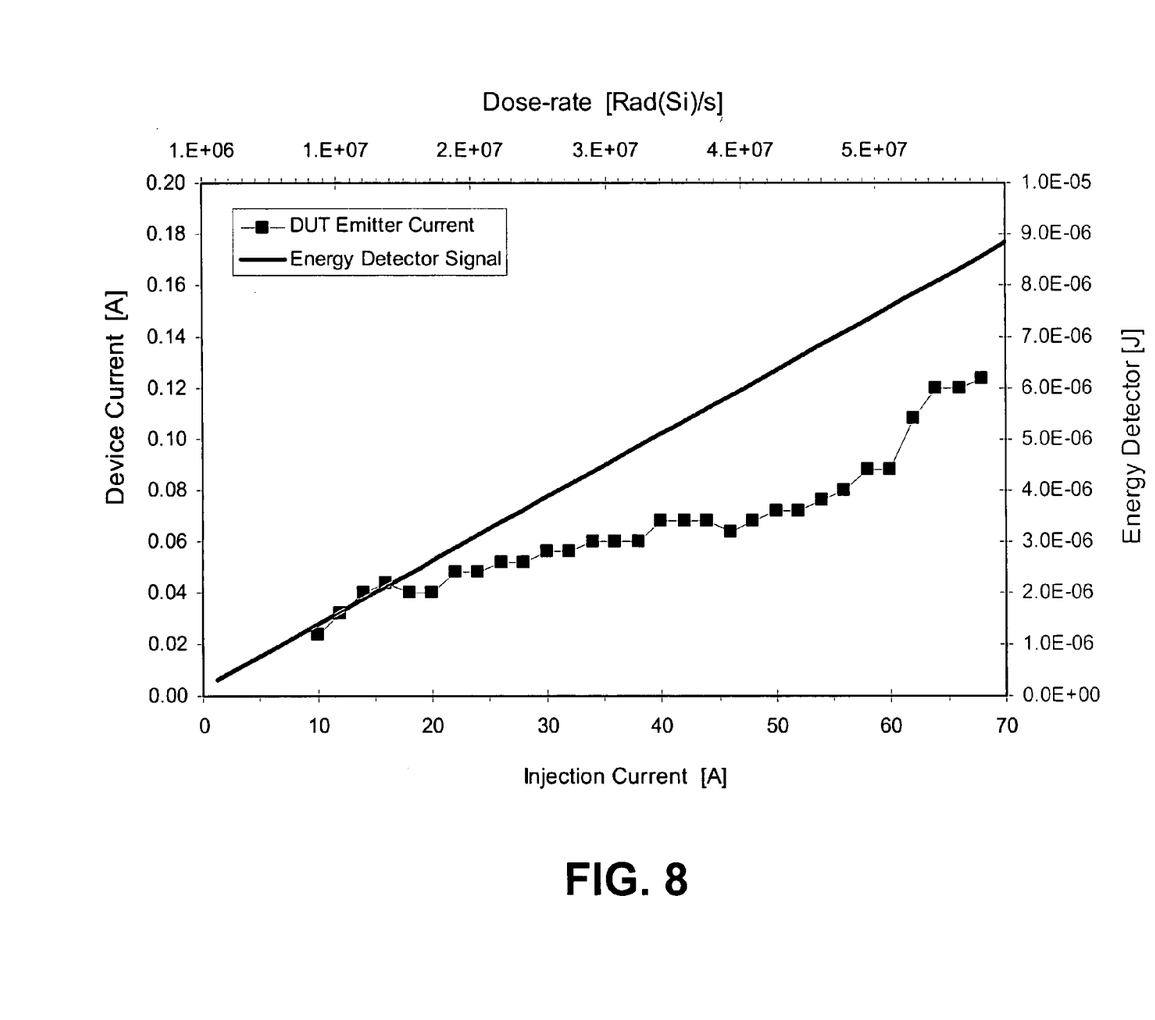
FIG. 8 shows results from a laser dose-rate response test utilizing electrical current measurements of the emitter of a bipolar junction transistor.
Figure 9:
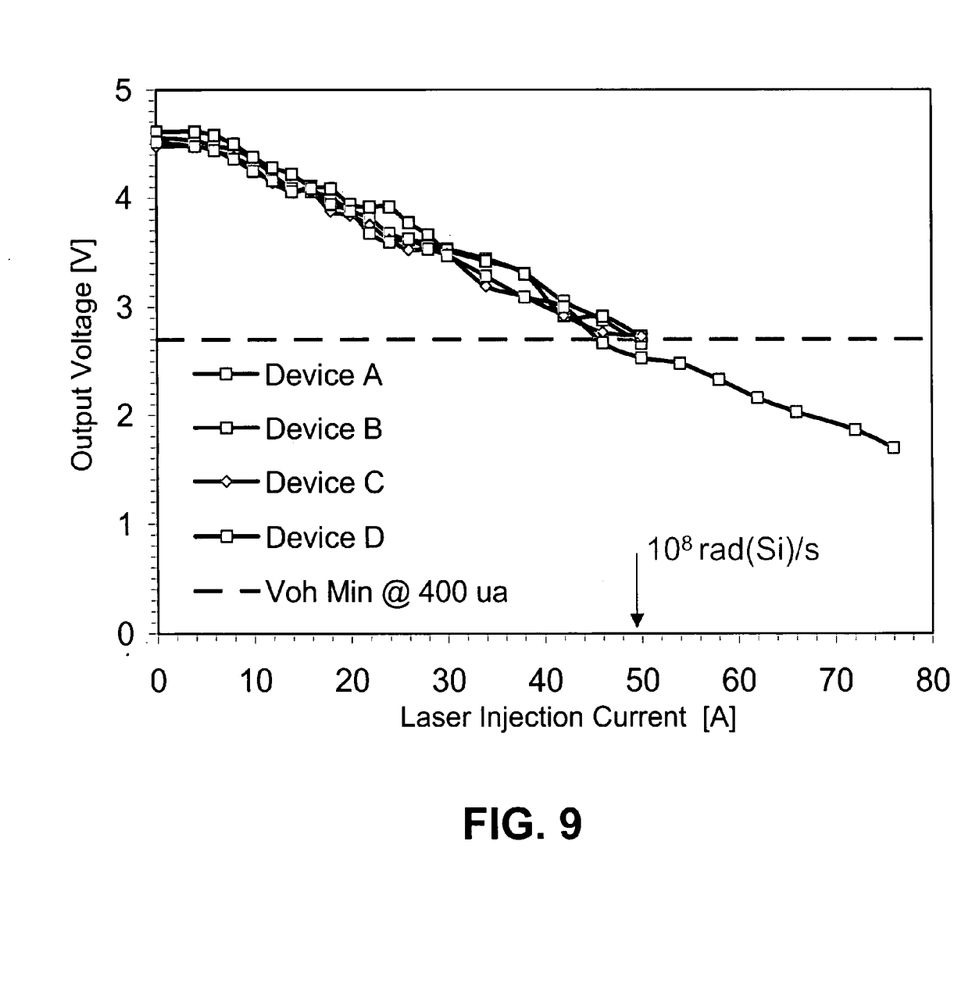
FIG. 9 shows results from a laser dose-rate response test utilizing logic failure testing of four different aged devices.
Figure 10:
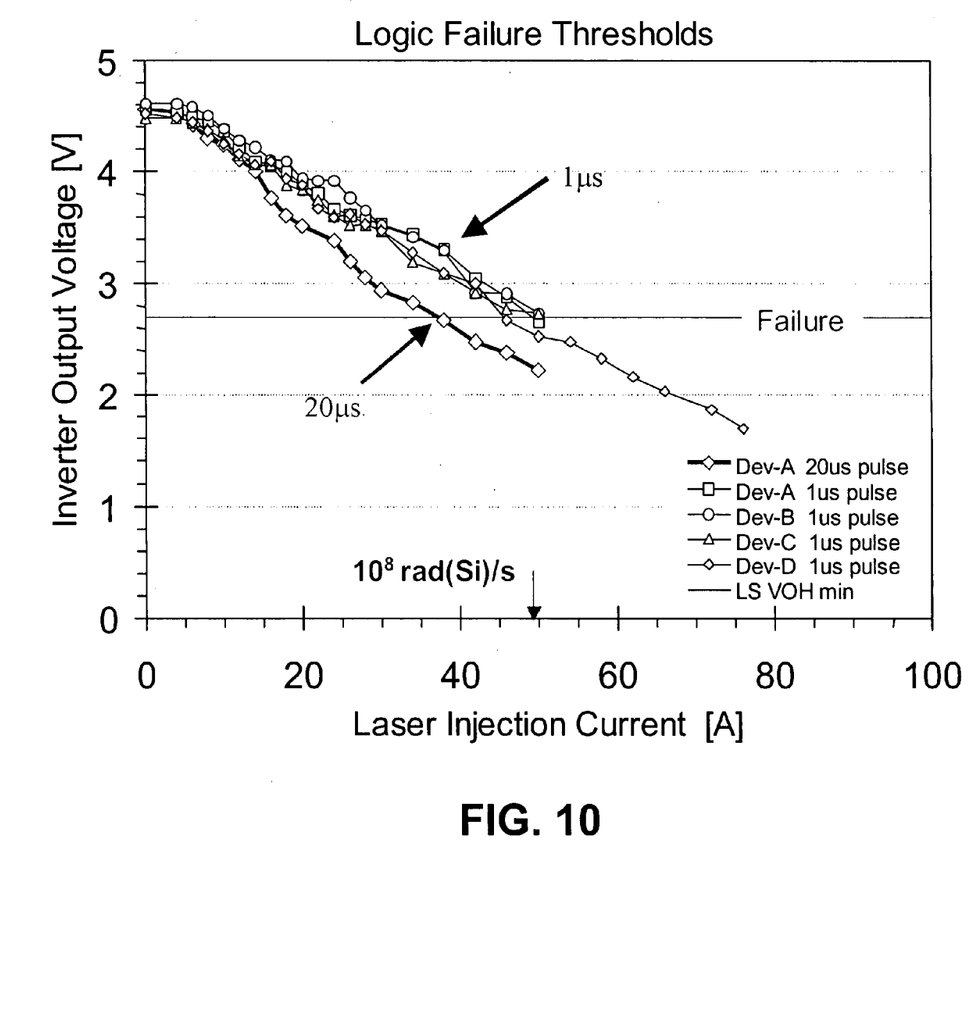
FIG. 10 shows results from a laser dose-rate response test utilizing different laser beam pulse widths to examine the pulse width dependence of the logic failure of the aged devices.

As described previously, the functional or parametric dose-rate response of the DUT can be quantified in a number of different ways. FIGS. 8, 9, and 10 provide examples of the application of the apparatus to some of the most common types of dose-rate response testing.

In FIG. 8 is shown the electrical current measured from the emitter of a bipolar junction transistor (labeled "DUT Emitter Current") as a function of dose-rate using the single beam splitter embodiment 30 shown in FIG. 5A. Also shown in the plot is a curve (labeled "Energy Detector Signal") representing the measured energy of the reflected laser pulse of the laser exposure as measured by the energy detector. As can be seen, the small scale non-linearity in the DUT response (emitter current) is not a consequence of any non-linearity in the applied dose-rate exposures, as evidenced by the linearity of the measured energy of the laser pulses.

The electrical response of a DUT can be measured for one or more laser light exposures and compared to a specified value to determine a deposited energy dependence of the failure of the semiconductor device. In FIG. 9 are shown results of a typical laser dose-rate logic failure test of four different logic inverter circuits (i.e., Devices A, B, C, and D) measured with the embodiment 20 shown in FIG. 3A. Failure in the devices is seen to occur when the minimum inverter output voltage falls below the manufacturer-specified value of $V_{oh}=2.7V$ at 400 µA. In this example, the failure is determined to be caused by a total energy deposition of about 12 µJ, corresponding to an equivalent dose-rate of about $10^8$ rad(Si)/s.

The broad-beam laser irradiation apparatus can be used to control the time-duration of the incident radiation pulse, varying from hundreds of nanoseconds to DC exposures. This time-duration feature can be used to examine the dependence of a device's failure on the radiation pulse width. Both the intensity and the duration of the dose-rate equivalent pulse can be varied in a controlled manner. The width of the radiation pulse can be controlled by the width of the injection current pulse, which in turn, can be controlled programmatically by the control software of the apparatus.

In FIG. 10 is shown an example of the pulse width-dependence of a device's failure. The device failure threshold depends on both the magnitude and the duration of the dose-rate pulse. In this example, the laser pulse intensity was kept constant and only the pulse width was varied. The wider, 20-µs-duration laser pulse produced failure in the test device at a lower effective dose-rate than the narrower, 1-µs-pulsewidth.

Time-Varying Dose-Rate Simulator

The injection current of the laser diode arrays can also be modulated to produce a time-varying, intensity-varying dose-rate equivalent laser exposure, within the dynamic limits of the single laser diode or diode array. Alternatively, embodiment 40 enables the use of multiple lasers, fired in a synchronized sequence, to deliver a greater range of laser intensities than is possible with any single laser diode array. This, in turn, can be used in conjunction with the injection of a pre-characterized, controlled, external, electrical transient on the power and ground lines of the DUT, whose introduction is synchronized with the delivery of the laser pulse. This combination of stimuli to the DUT replicates the charge generation effects of the dose-rate exposure internal to the DUT and the external electrical transients that the DUT experiences from the surrounding circuit's exposure to the radiation.

Figure 11:
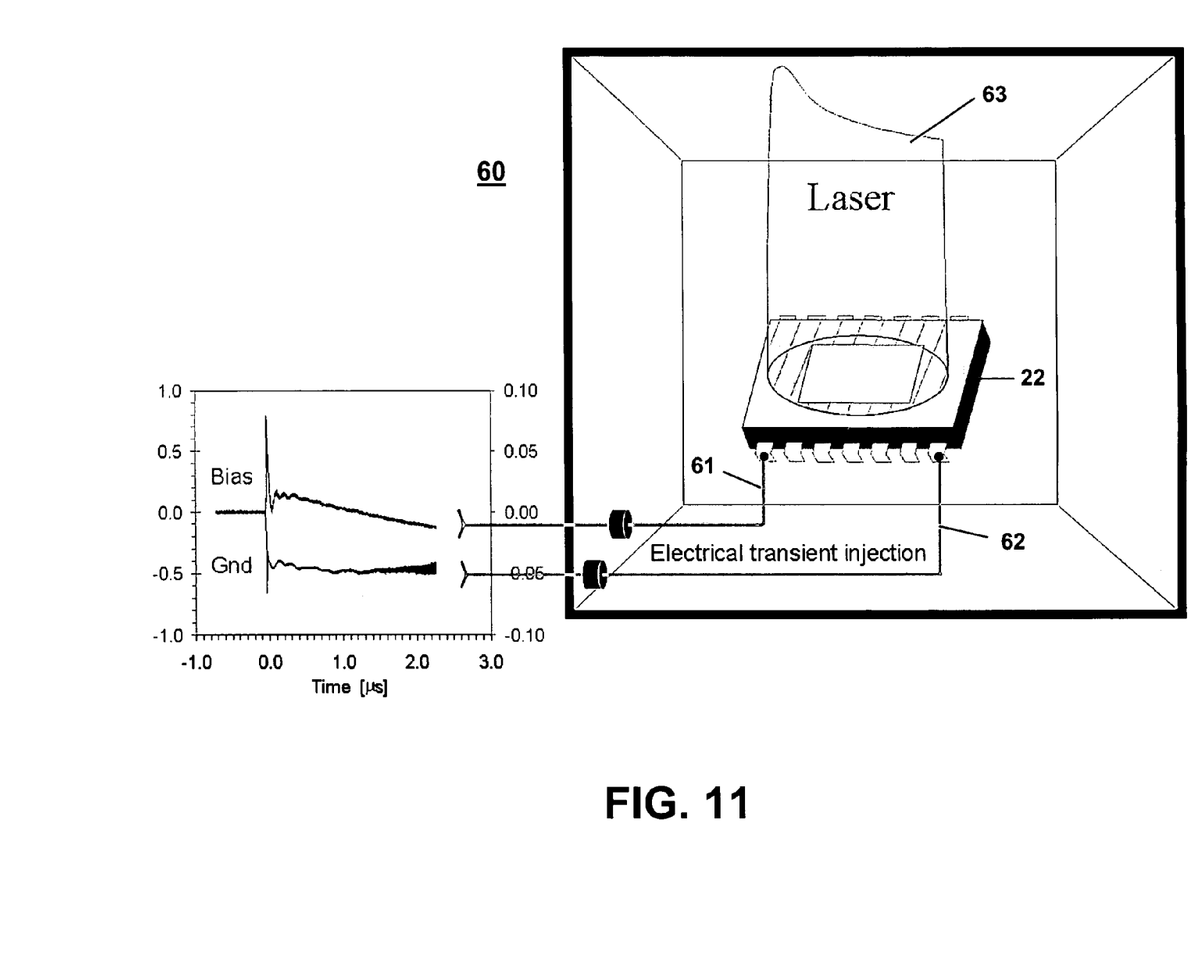
FIG. 11 shows a schematic illustration of an apparatus to provide a time-varying, intensity-varying, dose-rate equivalent exposure of a DUT in synchronization with the injection of ground plane and power line transients.

Thus, the broad-beam laser irradiation apparatus can be used to recreate a time-varying, intensity-varying, dose-rate equivalent exposure of a DUT that is embedded in a larger circuit or circuit fragment. The fidelity of the simulation is enhanced by the synchronized injection of electrical transients into the ground line and power line of the DUT. These transients, measured at x-ray or electron exposure facilities, provide and represent the response of other irradiated portions of the surrounding circuit components. The use of traditional x-ray or electron exposure facilities can be used to determine the electrical transient produced by devices that are not amenable to laser testing (e.g., carbon resistors, ceramic capacitors, and other non-silicon devices) contained in the surrounding circuitry. The time-varying intensity of the dose-rate laser exposure can be controlled by both the firing sequencing of the different laser diode arrays and by modulating the injection current into each laser diode array while it is firing. The modulations are controlled using programmable arbitrary waveform generators. In FIG. 11 is shown a schematic illustration of an apparatus 60 comprising a combined laser dose rate-equivalent exposure 63 occurring in synchronization with the injection of pre-determined electrical transients into the ground and power lines 61 and 62 of the DUT 22.

The present invention has been described as a laser-based apparatus and method to measure the functional and parametric response of semiconductor devices to pulsed laser irradiation. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A broad-beam laser irradiation apparatus for measuring the dose-rate response of a semiconductor device under test, comprising:

at least one infrared laser that produces a, broad-area pulse of laser light, having a laser pulsewidth and intensity, directed onto the surface of the semiconductor device, and means for measuring the functional or parametric response to charge generated in an electrically active region of the semiconductor device resulting from the laser irradiation of the surface of the semiconductor device.

2. The apparatus of claim 1, wherein the infrared laser comprises a laser diode or laser diode array.

3. The apparatus of claim 1, wherein the wavelength of the infrared laser provides a penetration depth comparable to the length-scale for charge collection of photocurrent in the electrically active region of the semiconductor device.

4. The apparatus of claim 1, wherein the measuring means comprises a waveform digitizer for measuring the charge collection signal from the semiconductor device.

5. The apparatus of claim 1, further comprising means for varying the pulsewidth of the laser pulse.

6. The apparatus of claim 1, further comprising means for time-varying the intensity of the laser irradiation.

7. The apparatus of claim 1, further comprising an imaging device to image the laser irradiation of the surface of the semiconductor device.

8. The apparatus of claim 7, wherein the imaging device comprises a charge coupled device array.

9. The apparatus of claim 1, further comprising an energy detector to measure the energy of the laser irradiation of the surface of the semiconductor device.

10. The apparatus of claim 1, further comprising at least one beam splitter to transmit a fraction of the light from each of the at least one infrared laser to the surface of the semiconductor device.

11. The apparatus of claim 10, wherein the remaining light from the at least one beam splitter is reflected onto an energy detector.

12. The apparatus of claim 10, wherein the light reflected from the surface of the semiconductor device is reflected by the at least one beam splitter into an imaging device.

13. A method for measuring the dose-rate response of a semiconductor device under test, comprising:

exposing the surface of the semiconductor device to a broad-area pulse of light, having a laser pulsewidth and intensity, from at least one infrared laser, and measuring the functional or parametric response to charge generated in an electrically active region of the semiconductor device resulting from the laser irradiation of the surface of the semiconductor device.

14. The method of claim 13, further comprising repeating the exposing and measuring steps at least once at a different laser deposited energy.

15. The method of claim 13, further comprising repeating the exposing and measuring steps at least once at a different laser pulsewidth.

16. The method of claim 13, further comprising injecting at least one electrical transient into an electrical line of the semiconductor device during the exposing step.

17. The method of claim 13, further comprising time-varying the intensity of the laser irradiation.

18. The method of claim 13, further comprising imaging the laser irradiation of the surface of the semiconductor device exposed to the broad-area pulse of light.

19. The method of claim 18, further comprising measuring the uniformity of the image of the laser irradiation.

* * * * *